United States Patent [19]

Erle et al.

[11] Patent Number: 5,796,990
[45] Date of Patent: Aug. 18, 1998

[54] HIERARCHICAL FAULT MODELING SYSTEM AND METHOD

[75] Inventors: Mark Alan Erle, South Burlington; Matthew Christopher Graf, Essex Junction; Peter Wohl, Williston, all of Vt.

[73] Assignee: International Business Machines Corporation, Armonk, N.Y.

[21] Appl. No.: 929,578

[22] Filed: Sep. 15, 1997

Related U.S. Application Data

[63] Continuation of Ser. No. 459,995, Jun. 2, 1995, abandoned.

[51] Int. Cl.[6] ........................................ G06F 11/263
[52] U.S. Cl. .................... 395/500; 364/488; 364/489; 364/490; 364/491; 364/578; 371/26
[58] Field of Search .................. 395/500; 364/488, 364/489, 490, 491, 578; 371/26

[56] References Cited

U.S. PATENT DOCUMENTS

| | | | |
|---|---|---|---|
| 3,702,011 | 10/1972 | Armstrong | 235/150 |
| 4,597,080 | 6/1986 | Thatte et al. | |
| 4,696,006 | 9/1987 | Kawai | |
| 4,965,743 | 10/1990 | Malin et al. | |
| 4,996,689 | 2/1991 | Samad | |
| 5,150,469 | 9/1992 | Jouppi | |
| 5,282,146 | 1/1994 | Aihara et al. | |
| 5,291,495 | 3/1994 | Udell, Jr. | |
| 5,410,548 | 4/1995 | Millman | 371/23 |
| 5,546,408 | 8/1996 | Keller | 371/27 |

OTHER PUBLICATIONS

G. Cserlan et al., "Dependability Analysis in HW–SW Codesign" IEEE, pp. 306–315 Feb. 1995.

*Primary Examiner*—Kevin J. Teska
*Assistant Examiner*—A. S. Roberts
*Attorney, Agent, or Firm*—James M. Leas

[57] ABSTRACT

A system and method for generating a fault model for a logic circuit includes a data storage device for storing information relative to fault models or primitive elements in a logic circuit and for storing fault models for each level of design in a hierarchical logic circuit, a processor for processing the stored information relative to primitives and lower level fault models in the hierarchy for generating fault models for each succeeding higher level of design in the hierarchy, an input device for operator input of information to modify primitive fault models and a display subsystem for displaying various aspects of the hierarchical fault model generated in accordance with the present invention.

4 Claims, 6 Drawing Sheets

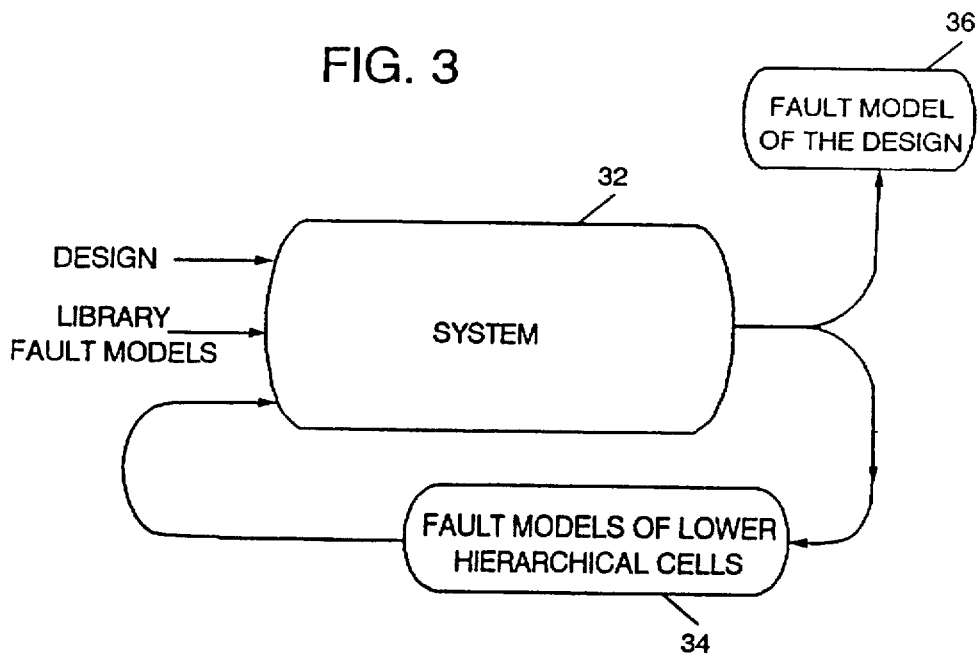
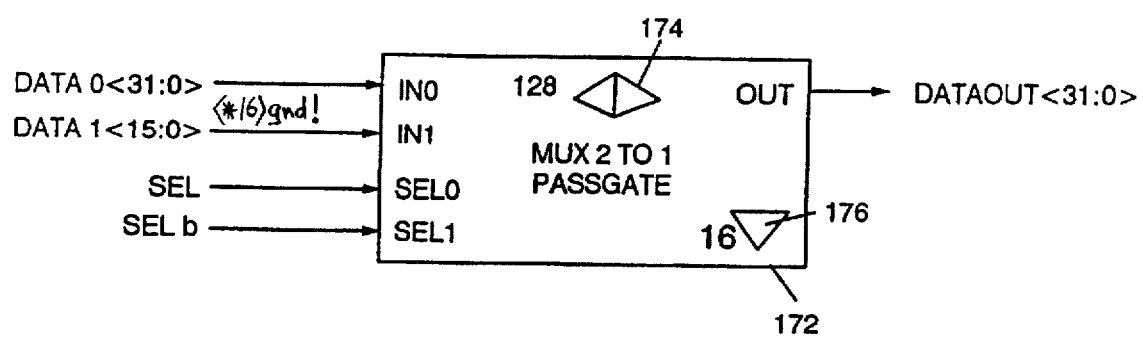

HIERARCHICAL FAULT MODELING SYSTEM AND METHOD

This application is a continuation of application Ser. No. 08/458,995, filed on Jun. 2, 1995, which was abandoned upon the filing hereof.

BACKGROUND OF THE INVENTION

1. Field of the Invention

The present invention relates to system and method for testing integrated circuits and, more particularly, to such system and method employing design hierarchy to construct fault models for efficient design and testing of the logic circuit.

2. Prior Art

The importance of testing of complex logical circuits such as microprocessors is well recognized.

In the prior art, there are generally two solutions to the test generation problem. These are referred to as functional tests and scan-based tests. Functional tests are manually written to test faults within the circuit under consideration. The effectiveness of the functional tests is generally evaluated by fault grading software and hardware which may be very expensive. In such case, a fault model is required. Scan tests are automatically generated and fault graded, but again a fault model is required. Further, highly effective automatic test generation limits design style to that which can be adequately modeled by manually written fault models.

The functional test involves the application of various test patterns to primary inputs of the logic circuit and monitoring the output signals from the logic signals. The output signals are compared to expected values to verify logic levels and timing. The fault test determines whether the circuit contains fabrication errors. The fault test is usually designed to detect as many faults as possible in a particular "fault model". The "stuck at" fault model is often used, wherein each fault corresponds to an input or output of a logic gate or other element in the logic circuit becoming fixed in a particular logic state. "Fault coverage" is a phrase which is commonly used to express how many or what percentage of potential faults in a given fault model would be detected during a test. As complexity of logic circuits increases, there is often a decrease in the fault coverage of the functional test. The reason that fault coverage may be less than 100% is that many potential fault sites in a complex circuit are relatively inaccessible or untestable. Even if accessible, a long sequence of test patterns may be required to propagate or reveal the fault at a primary circuit output. As the number of inaccessible fault sites increases, the time required to develop test patterns and to test the logic circuit becomes excessive.

In summary, the prior art generally teaches that high performance design, high quality testing and automatic test generation cannot be achieved simultaneously.

In the prior art, there are several patents which generally relate to testing of logic circuits. Among these are the following:

U.S. Pat. No. 5,291,495 entitled "METHOD FOR DESIGNING A SCAN PATH FOR A LOGIC CIRCUIT AND TESTING OF SAME" covers a method of determining potential untestable circuit faults and subsequently reducing these untestable circuit faults. The method taught in this patent deals with a complete design and does not teach nor suggest any hierarchical construction of either fault models or tests as is taught and claimed by the present invention.

U.S. Pat. No. 5,282,146 entitled "TEST ASSISTANT SYSTEM FOR LOGIC DESIGN PROCESS" covers a system which generates test patterns for complete logic designs. As above, this patent does not teach nor suggest a hierarchical construction of either fault models or tests.

U.S. Pat. No. 4,696,006 entitled "METHOD OF GENERATING TEST PATTERNS FOR LOGIC NETWORK" describes a test pattern generation method which involves identification of controllable nodes, observable nodes and path segments between such nodes.

Also as above, this patent does not teach nor suggest a hierarchical construction of fault models or tests.

U.S. Pat. No. 4,965,743 entitled "DISCRETE EVENT SIMULATION TOOL FOR ANALYSIS OF QUALITATIVE MODELS OF CONTINUOUS PROCESSING SYSTEM" describes a qualitative modeling tool for creating, simulating, experimenting with and analyzing qualitative models. Since this patent relates to the area of qualitative modeling as opposed to quantitative logic circuit modeling and test generation, it neither teaches nor suggests the present invention as claimed.

U.S. Pat. No. 4,996,689 entitled "METHOD OF GENERATING TESTS FOR A COMBINATIONAL LOGIC CIRCUIT" describes a method for generating tests for a class of combinational logic circuits made up of a limited set of basic elements such as OR and AND gates.

Since this patent does not teach nor suggest the complex logic circuit modeling and test generation, it neither teaches nor suggests the present invention as claimed.

U.S. Pat. No. 4,597,080 entitled "ARCHITECTURE AND METHOD FOR TESTING VLSI PROCESSORS" describes a test method as contrasted to a method to generate fault models as does the present invention. Thus, the present invention as taught and claimed herein is patentably distinct from this patent.

SUMMARY OF THE INVENTION

Therefore, it is an object of the present invention to generate a fault model for a logic circuit by a system and method which construct fault models for each design level in a hierarchical design of a logic circuit.

Accordingly, a system and method include storage for storing information relative to fault models for primitive elements in a logic circuit and for storing fault models for each level of design in a hierarchical logic circuit, a processor for processing the stored information relative to primitives and lower level fault models in the hierarchy for generating fault models for each succeeding higher level of design in the hierarchy, input means for operator input of information to modify primitive fault models and a display subsystem for displaying various aspects of the hierarchical fault model generated in accordance with the present invention.

A method according to the present invention includes generating fault models for primitive elements of the logic circuit, identifying the next cell up in the hierarchy of the logic circuit, creating a netlist of all connections in the next (parent) cell in the hierarchy, identifying all possible faults in the parent cell, collapsing equivalent faults in the parent cell, deleting (exporting) faults of all cells below the parent cell and their equivalent faults, identifying new untestable faults and storing with the parent cell, and testing to determine if the parent cell is the top cell of the logic circuit. If so, the fault model is complete. If not, determine if there is another cell not previously fault-modeled at the same level as the previous parent cell. If not, return to the above-identified process and continue with the next cell in the hierarchy. If so, identify another cell at the same level as the parent cell as the new parent cell and return to the above-identified process at the step which identifies the netlist for the new parent cell. This process continues until the top cell of the design has been fault modeled which completes the hierarchical fault modeling for the entire logic circuit.

Implementation of hierarchical fault modeling in accordance with the present invention has the advantage of saving considerable processing and engineering time.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 3 is a schematic diagram of the hierarchical fault modeling test generation system in accordance with the present invention.

FIG. 7 is a fault modeling example of a level 2 logic circuit in accordance with the present invention.

DETAILED DESCRIPTION OF A PREFERRED EMBODIMENT OF THE INVENTION

Figure 1:
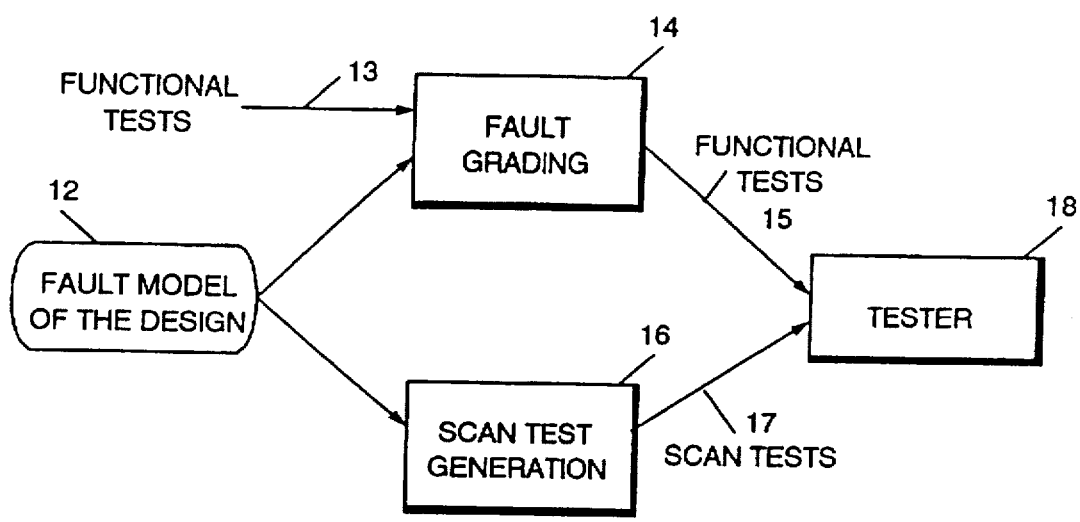
FIG. 1 is a schematic diagram of a prior art test generation method.
Figure 2A:
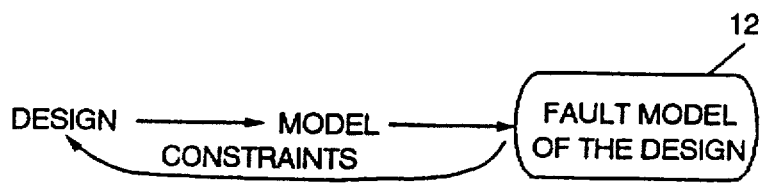
FIG. 2 is a schematic diagram of prior art fault model generation.
Figure 2B:
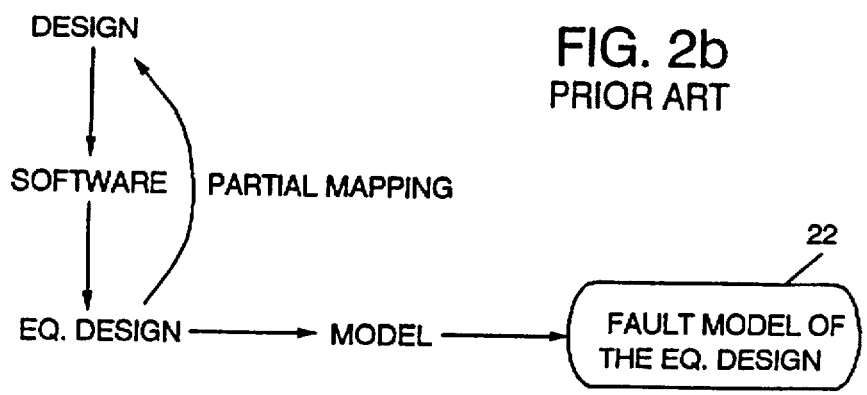

Referring now to FIGS. 1 and 2, prior art test generation and fault model generation will be generally described to provide a contrast to the present invention.

An overall fault model of the design to be tested 12 can be input to two separate processes. The first is functional fault grading 14, and the second is scan test generation 16. Also input to the fault grading 14 are the manually generated functional tests 13. After fault grading, functional tests 15 are then input to tester 18. Also, scan tests 17 are input to tester 18 for the testing of a logic circuit (not shown).

An overview of prior art fault model generation is shown generally in FIG. 2. In a first approach identified as (a), a design is created by a first entity while a fault model is generated by a second entity. If directly applied to custom design, this linear fault model generation method would result in a very large number of untestable faults contained in the fault model. This results in constraints on the design style.

In the second approach shown in FIG. 2 at (b), the design is less constrained, but fault modeling is performed on an equivalent design obtained from the original design through automatic methods. Partial mapping between the original design and the equivalent design complicates diagnostic tests, design for testability and efficient use of test generation tools, particularly when applied to a custom design.

In the first prior art fault model generation shown at (a), a fault model of a design is generated at 12 which might be input to the general test method shown in FIG. 1 above, while in the second approach shown at (b), a fault model of the equivalent design is generated at 22 for use with a general test method such as shown in FIG. 1.

FIG. 3 is a block diagram of the environment for hierarchical fault modeling in accordance with the present invention. The modeling system in accordance with the present invention 32 receives as inputs the logic circuit design and one or more fault models from a library of fault models for primitive elements of a logic circuit. The system produces as an output a fault model for each level in the hierarchy which may be combined through feedback path 34 with information about higher levels in the hierarchy to generate a fault model for the entire logic circuit based upon the hierarchy of the system. Thus, the fault model of the entire design 36 results from the iterative process according to the present invention.

Figure 4A:
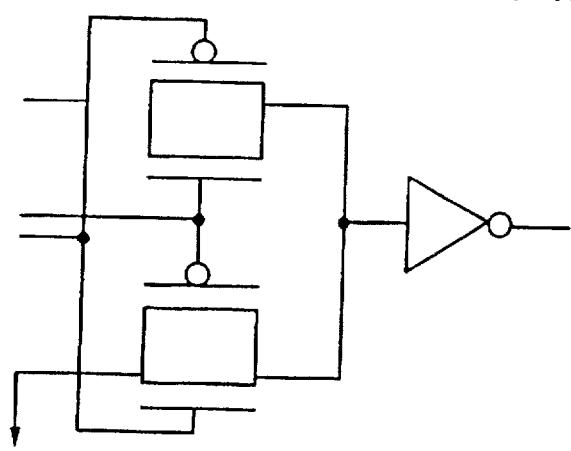
FIG. 4 is a schematic diagram showing three design styles which can introduce untestable faults in a test generation method.
Figure 4B:
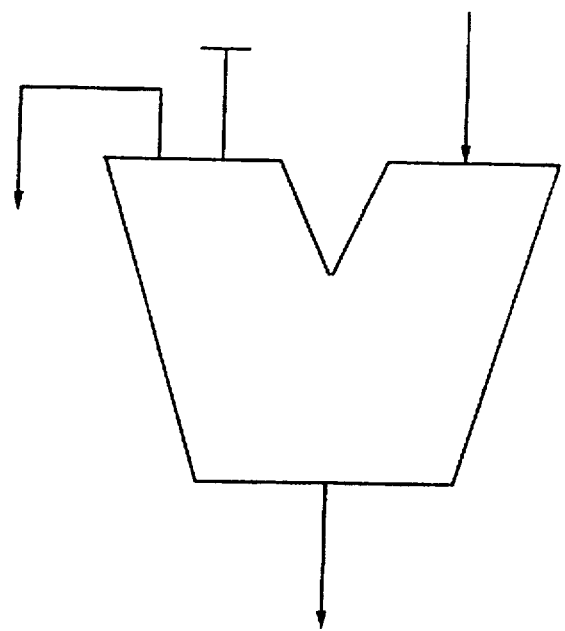
Figure 4C:
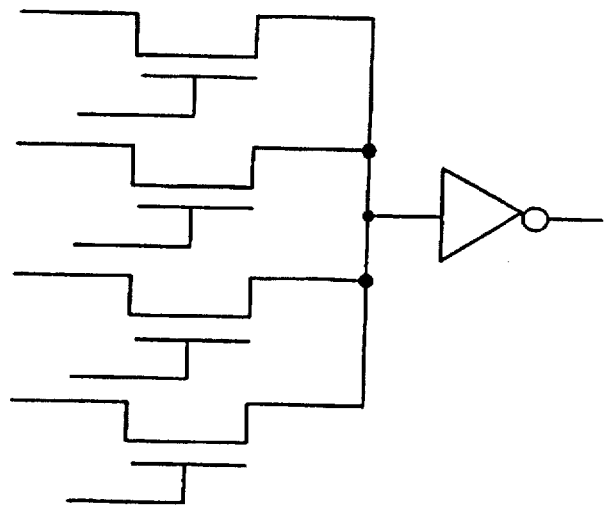

Referring now to FIG. 4, three design styles which introduce untestable faults are shown. In (a), a multiplexor used as a NAND circuit is shown; in (b), an adder used as an incrementor is shown; and in (c), a four-way multiplexor is shown.

The circuit shown in (a) might be used for improved performance, whereas the circuit shown in (b) might be employed to make one adder perform two functions in a reuse mode, and the circuit shown in (c) may be used to reduce area on an integrated circuit chip.

Figure 5:
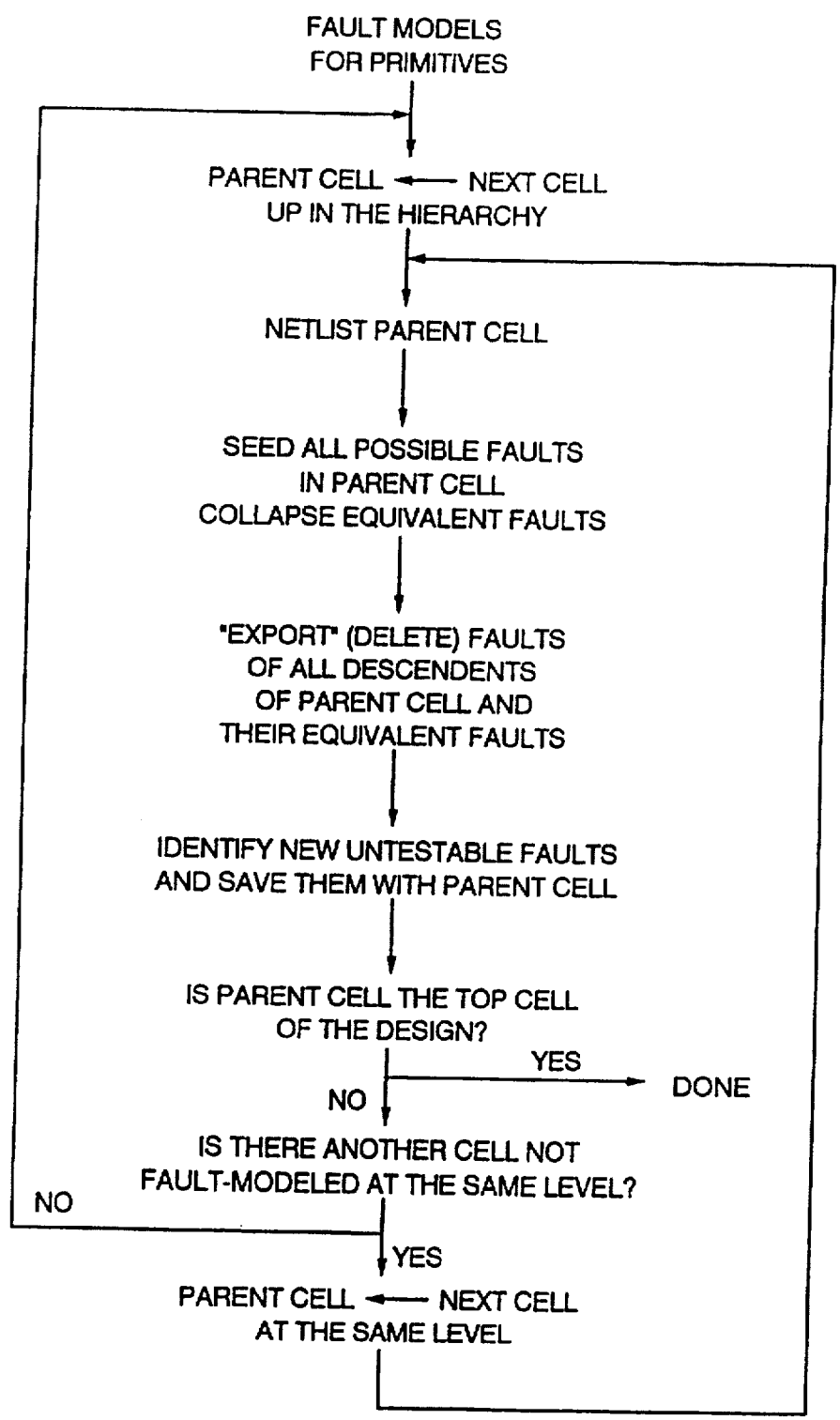
FIG. 5 is a flow chart of the fault modeling generation method in accordance with the present invention.

Referring now to FIG. 5, the method in accordance with the present invention will be described in greater detail.

Fault models for primitive elements of the logic circuit may be written or obtained from a library of primitive fault models.

In a particular design, the primitive cells may be obtained from a standard cell design library. Examples of these primitive cells are logic gates, passgates, field effect transistors (FET), latches and power supplies. FETs and power supplies are considered primitive cells because they are the lowest level building blocks of the design. Passgates and logic gates are built from FETs, but are considered primitive cells to reduce the overall primitive count as contrasted to having all cells described by several FETs. Latches are characterized as primitive cells to facilitate clock rules checking and sequential behavior identification by the test method.

A fault model has the same logical function as the circuit it represents and additionally indicates to the test method the type and location of faults. For the purposes of the description of the preferred embodiment of the present invention, the stuck-at fault model will be used. The same principles will apply to other fault models such as quiescent current ($I_{DDQ}$), AC transition, toggle, open and shorts.

As an example of a fault model, the fault model of a NAND gate is the behavior describing the function in the syntax of the test software being employed.

The following is an example of a fault model of a NAND gate:

```
model NAND2 (Y,A,B)
(
    input (A,B) ()
    output (Y) (function = ! (A*B);)
)
```

As a more complex example, the fault model of a passgate includes instructions to the test software not to place faults on control lines, as these stuck-at faults are redundant and their presence would only waste processor time and memory. As an example, the following code may be used to describe the model:

```
model passgate (A,C,CB,Y)
(
    input (A) ()
    input (C,CB) (no_fault = sa0 sa1;)
    output (Y) (primitive = _cmos1 (A,C,CB,Y);)
)
```

The following rules apply to fault models of design cells obtained from fault models of subcells in accordance with the present invention:

(1) The interconnection network that binds subcells of a cell also binds the fault models of subcells;

(2) The faults of a cell's fault model are the union of the faults in the subcell's fault models, less proven untestable faults;

(3) The untestable faults excluded at step 2 are:
   (a) all untestable faults of the subcells, which are exported (deleted) from the fault model of the cell; and
   (b) new untestable faults identified by running the test software on the cell level, after untestable faults from subcells have been removed from the fault list.

Step 3 above is very important because test software spends a great deal of resource (processor time and storage) in identifying untestable faults. The deletion (export) of untestable faults is based on the observation that the controllability of inputs and the observability of outputs will not increase from a stand-alone subcell to the subcell integrated into a cell. Exporting untestable faults is highly effective because cells are reused. Moreover, proving any fault untestable becomes harder as it is nested deeper in the design hierarchy.

Again, referring to FIG. 5, the remaining steps of the fault modeling method in accordance with the present invention will be described.

After the fault models for the primitive elements of the logic circuit are generated as described above, the process moves to the next cell in the hierarchy above the primitive element. This next cell in the hierarchy is referred to for convenience as a "parent cell".

A netlist of the parent cell is then generated and all possible faults in the parent cell are identified.

Next, all equivalent faults in the parent cell are identified and collapsed to a minimum number of faults representing the equivalent classes.

Next, faults of all descendants of the parent cell and their equivalent faults are deleted or "exported".

New untestable faults are then identified and stored with the fault model of the parent cell.

A test is made to determine if the parent cell under consideration is the top cell of the logic circuit design. If it is the top cell, then the fault model generation is completed and the process terminates. If it is not the top cell, a test is made to determine if there is another cell which has not yet been fault modeled at the same level in the logic circuit design. If there is another cell which has not been fault modeled at the same level, such other cell is then identified as the current parent cell and the process returns to determining the netlist for this new parent cell.

If there is no other cell which has not been fault modeled at the same level, the process then returns to the starting point and searches for next level parent cells in the design hierarchy.

This process continues until the entire logic circuit design including all levels of the hierarchy have been fault modeled.

Figure 6:
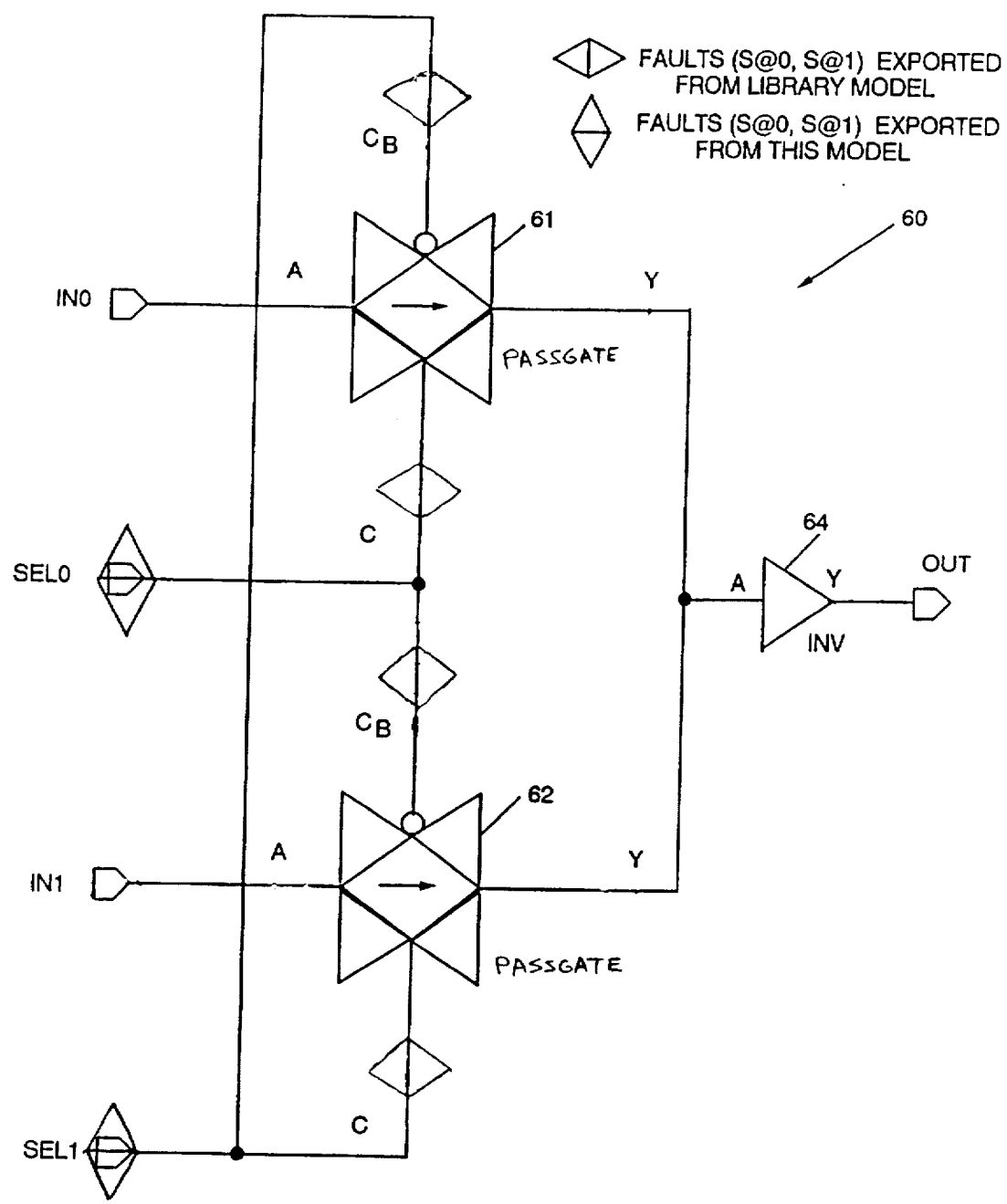
FIG. 6 is a schematic diagram of an example of fault modeling for a simple (level 1) circuit in accordance with the present invention.

Referring now to FIG. 6, a fault model example of a level 1 design constructed from cells stored in the standard library will be described in greater detail. Level 1 logic circuit 60 includes passgates 61 and 62 and inverter 64. Inputs are IN0, SEL0, IN1, and SEL1. There is a single output labeled OUT. The automatic test generation program seeds stuck-at faults (s@0 and s@1) on the input and output pins of each primitive except for the 8 faults on the control lines of the passgates.

The faults identified with the diamonds having a longer horizontal axis are those faults stuck-at 0 or stuck-at 1 (s@0, s@1) exported from the library cells. The faults identified with diamonds having the longer axis in the vertical direction are those stuck-at faults exported from logic circuit 60.

The automatic test generation program is run on the circuit 60 and untestable faults are detected, in this case on lines SEL0 and SEL1. These untestable faults are then exported as discussed above with reference to FIG. 5.

Referring now to FIG. 7, a level 2 logic circuit design will be discussed. Level 2 logic circuit design 70 employs a level 1 design shown in FIG. 6 as well as cells from a standard library. Circuit 172 includes 32 'mux 2 to 1 passgate' cells. As a result, 128 pairs of faults from passgate control lines are eliminated as indicated at 174 and 4 faults on the inverters are eliminated for a total of 260 faults being eliminated thus greatly improving the efficiency of the automatic test generation. The test generation is then run on the level 2 design and 16 untestable faults are identified. These are the stuck-at 0 faults on 16 grounded inputs. The 16 faults identified at 176 are then exported from this model. Faults in the inverter chain consisting of inverter 72 and 74 are identified at 76 and 78 and these are stuck-at 0 or stuck-at 1 faults exported from the lower model.

The accuracy of the fault model is enhanced by exporting untestable faults since most untestable faults are caused by reusing macro cell designs such as adders, multiplexors or registers and customizing their functionality (for example, by connecting inputs to constant values as shown in FIG. 4). In effect, part of the circuit in the reused cell is not exercised so faults will not cause a malfunction. Some faults are untestable under a certain fault model, but testable under a different fault model. For example, faults on control inputs of a CMOS PASSGATE are untestable as stuck-at, but testable in an AC transition fault model. Exporting faults allows test software to focus on relevant faults under each fault model.

Since test software has certain limitations, some faults are untestable as a result of these limitations. Such faults need to be recognized to avoid wasted effort and perhaps employ additional test software. The invention described herein identifies the source of these faults that otherwise would appear as a multitude of unexplainable untestable faults due to test software limitations.

Figure 8:
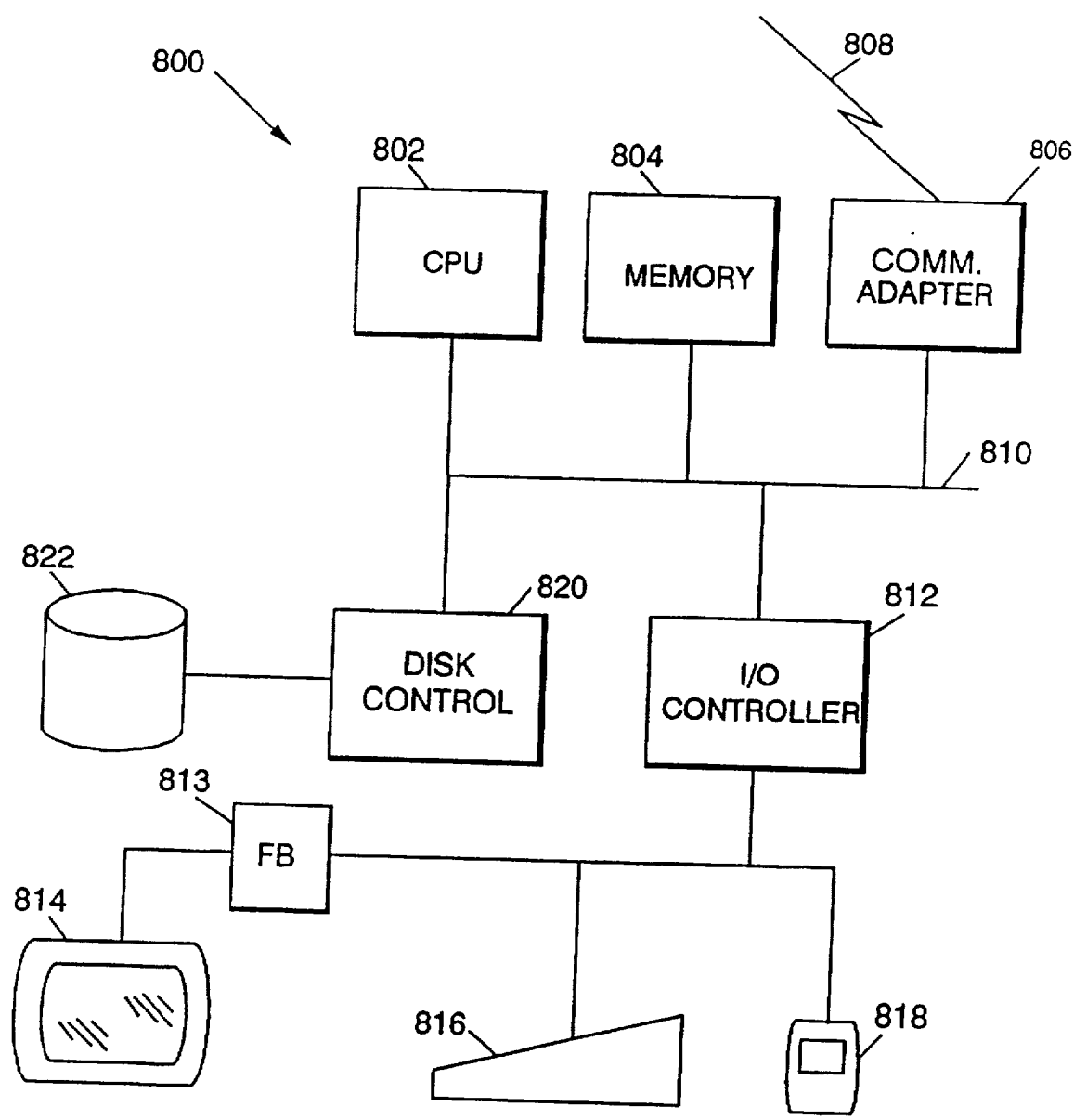
FIG. 8 is a block diagram of a data processing system implementing the system and method according to the present invention.

Referring now to FIG. 8, a hardware system for implementing the present invention will be described in greater detail. System 800 includes one or more processing units 802 connected to one or more system busses 810. A memory subsystem 804, communications adapter 806 having communications line 808 connected to other systems, a disk control unit 820 and an I/O control unit 812 are also connected to system bus 810.

I/O controller 812 provides communication between system bus 810 and display subsystem 813, which provides visual output information to display device 814, keyboard input device 816, and cursor control device such as mouse 818. Disk controller 820 controls storage and retrieval of information in disk subsystem 822.

In the implementation of the system and method according to the present invention as described above, processors 802 actively process the generation of the fault model and the automatic test generation associated with the fault model from data stored in memory 804 or in disk array 822. Results are displayed on display device 814 and operator input may be obtained from keyboard 816 or cursor control device 818. Results of the fault modeling generation or of an automatic test generation incorporating the results of the fault modeling generation may be transmitted to other systems through communications adapter 806 on communication lines 808.

The system according to Applicant's invention obtains fault models which are very accurate since the test software is focused on detectable real fault sites. Further, the design is not constrained for testing, thus allowing higher performance and/or smaller area designs. Significant engineering time is saved by automating the generation of fault models.

Most importantly, the system and method according to the present invention dramatically reduces processor usage and engineering time by avoiding wasted time or storage on untestable faults.

Although the present invention and its advantages have been described in detail, it should be understood that various changes, substitutions and alterations can be made herein without departing from the spirit and scope of the invention as defined by the appended claims.

What is claimed is:

1. A method for hierarchically generating a fault model of a logic circuit according to a particular type of fault model, said method comprising the steps of:

generating fault models for primitive cells of the logic circuit according to the particular type of fault model, the primitive cells constituting a lowest level in the hierarchy of the logic circuit;

identifying a parent cell corresponding to a next cell in the hierarchy of the logic circuit;

creating a netlist of all connections in said parent cell;

seeding and identifying all possible faults in said parent cell, including equivalent faults and untestable faults, the untestable faults corresponding to faults which are not testable under the particular type of fault model;

collapsing the equivalent faults in said parent cell;

deleting untestable faults of all cells below said parent cell and their equivalent faults;

identifying new untestable faults by executing test software on said parent cell after untestable faults from cells below said parent cell have been removed from a fault model of said parent cell, and storing the new untestable faults in the fault model of said parent cell;

first testing to determine if said parent cell is a top cell in the hierarchy of said logic circuit;

second testing to determine if there is another cell not previously fault modeled at a same level in the hierarchy of said logic circuit as said parent cell;

identifying said another cell at said same level as said parent cell as a new parent cell;

repeating each step set forth above for said new parent cell; and continuing said steps, beginning from the step of identifying the parent cell, until said top cell of said logic circuit has been fault modeled.

2. A system for hierarchically generating a fault model of a logic circuit according to a particular type of fault model, said system comprising:

a storage device for storing information relative to fault models for primitive cells in the logic circuit according to the particular type of fault model, the primitive cells constituting a lowest level in a hierarchical logic circuit, said storage device further for storing fault models for each level of design in the hierarchical logic circuit as the fault models are generated;

a processor, for generating the fault models for each succeeding higher level in the hierarchical logic circuit from the stored information until a top cell of the logic circuit has been fault modeled, said processor further including a means for creating a netlist of all connections of a parent cell in the hierarchy of the hierarchical logic circuit, wherein said storage device further includes means for storing identified untestable faults with a fault model of a parent cell;

one or more input devices for inputting information to modify one or more fault models for the primitive cells; and a display subsystem for displaying various aspects of said hierarchical fault model.

3. The system according to claim 2, further comprising:

means for generating fault models for primitive cells of said logic circuit.

4. A system for hierarchically generating a fault model of a logic circuit according to a particular type of fault model, said system comprising:

means for generating fault models for primitive cells of the logic circuit according to the particular type of fault model, the primitive cells constituting a lowest level in the hierarchy of the logic circuit;

means for identifying a parent cell corresponding to a next cell in the hierarchy of the logic circuit;

means for creating a netlist of all connections in said parent cell;

means for seeding and identifying all possible faults in said parent cell, including equivalent faults and untestable faults, the untestable faults corresponding to faults which are not testable under the particular type of fault model;

means for collapsing the equivalent faults in said parent cell;

means for deleting untestable faults of all cells below said parent cell and their equivalent faults;

means for identifying new untestable faults by executing test software on said parent cell after untestable faults from cells below said parent cell have been removed from a fault model of said parent cell, and storing the new untestable faults in the fault model of said parent cell;

means for first testing to determine if said parent cell is a top cell in the hierarchy of said logic circuit;

means for second testing to determine if there is another cell not previously fault modeled at a same level in the hierarchy of said logic circuit as said parent cell;

means for identifying said another cell at said same level as said parent cell as a new parent cell;

means for repeating each step set forth above for said new parent cell; and means for repeating each of the above steps until said top cell of said logic circuit has been fault modeled.

* * * * *